United States Patent
Wang et al.

(10) Patent No.: US 12,287,464 B2
(45) Date of Patent: Apr. 29, 2025

(54) MULTI-ELEMENT WIDE-FIELD LENS FOR WAFER-ASSEMBLED CHIP-CUBE CAMERAS

(71) Applicant: OmniVision Technologies, Inc., Santa Clara, CA (US)

(72) Inventors: Kuang-Ju Wang, Taipei (TW); Jau-Jan Deng, Taipei (TW); I-Lung Lu, New Taipei (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 260 days.

(21) Appl. No.: 18/086,522

(22) Filed: Dec. 21, 2022

(65) Prior Publication Data

US 2024/0210663 A1    Jun. 27, 2024

(51) Int. Cl.

| | |
|---|---|
| *G02B 13/00* | (2006.01) |
| *G02B 13/06* | (2006.01) |
| *H01L 27/146* | (2006.01) |
| *H04N 23/55* | (2023.01) |
| *G02B 9/12* | (2006.01) |
| *G03B 9/02* | (2021.01) |

(52) U.S. Cl.
CPC ..... *G02B 13/0085* (2013.01); *G02B 13/0035* (2013.01); *G02B 13/06* (2013.01); *H01L 27/14645* (2013.01); *H01L 27/14687* (2013.01); *H04N 23/55* (2023.01); *G02B 9/12* (2013.01); *G03B 9/02* (2013.01)

(58) Field of Classification Search
CPC .......... G02B 13/0085; G02B 13/0035; G02B 13/06; G02B 9/12; H01L 27/14645; H01L 27/14687; H01L 27/14618; H01L 27/14685; H01L 27/14625; H04N 23/55; H04N 23/54; H04N 23/555; G03B 9/02
See application file for complete search history.

(56) References Cited

U.S. PATENT DOCUMENTS

| | | | |
|---|---|---|---|
| 8,749,897 B2 | 6/2014 | Cheng | |
| 9,778,443 B2 | 10/2017 | Cheng et al. | |
| 9,798,115 B1 | 10/2017 | Yin et al. | |
| 2024/0184085 A1* | 6/2024 | Cheng | G02B 13/04 |

* cited by examiner

*Primary Examiner* — James C. Jones
(74) *Attorney, Agent, or Firm* — COZEN O'CONNOR

(57) ABSTRACT

A chip-level camera includes an image sensor; a concave L1 lens element on an inside surface of a first substrate; a convex L2 lens element on a first surface of a second substrate; a diaphragm stop on a second surface of the second substrate or on a first surface of a third substrate, the diaphragm stop between the second and third substrates; a convex L3 lens element on a second surface of the third substrate spaced from the image sensor; a first spacer holding first substrate at a predetermined distance from the second substrate; and a second spacer holding the second substrate a predetermined distance from the image sensor. In embodiments, lens element L1 has concave aspheric radius of R1, and lens L2 convex aspheric radius of R2, such that 1.3<ABS(R2/R1)<2.2 and/or lens L3 has convex aspheric radius R3, where 1.1<ABS(R3/R1)<2.4.

14 Claims, 3 Drawing Sheets

Fig. 3A          Air Gaps

MULTI-ELEMENT WIDE-FIELD LENS FOR WAFER-ASSEMBLED CHIP-CUBE CAMERAS

BACKGROUND

Miniature chip-cube cameras may be produced using a variety of techniques, including wafer-level assembly. These miniature cameras have a wide range of applications from endoscopes and borescopes, mobile telephones and tablets, security cameras, vehicles, and in other applications where small, unobtrusive, cameras are desired. This diversity of applications results in a wide range of lens requirements. For some applications, a lens system with wide field-of-view (FOV), compact size, and good optical performance is required.

SUMMARY

A chip-level camera designated A includes an image sensor; a concave L1 lens element on an inside surface of a first substrate; a convex L2 lens element on a first surface of a second substrate; a diaphragm stop on a second surface of the second substrate or on a first surface of a third substrate, the diaphragm stop between the second and third substrates; a convex L3 lens element on a second surface of the third substrate spaced from the image sensor; a first spacer holding first substrate at a predetermined distance from the second substrate; and a second spacer holding the second substrate a predetermined distance from the image sensor. In embodiments, lens element L1 has concave aspheric radius of R1, and lens L2 has convex aspheric radius of R2, such that 1.3<ABS(R2/R1)<2.2 and lens L3 has convex aspheric radius R3, where 1.1<ABS(R3/R1)<2.4.

BRIEF DESCRIPTION OF THE DRAWINGS

FIG. 3A portrays simulated ray tracings of an embodiment according to Tables 1 and 3 and FIG. 1.

DETAILED DESCRIPTION

In embodiments, a multi-lens-surface, wafer-level, puddle lens system for a compact imaging camera has a wide range field of view (FOV 90 to 130 degrees), low F number, and low distortion, It may be used with either visible light or near infrared (NIR) light. In an embodiment, the lens system has 3 lens surfaces and an overall diameter of less than three millimeters, making it useful in chip-level cameras for endoscopes, borescopes, security cameras, and many other applications where wide-angle, fixed-focus, electronic cameras are desired.

Figure 1:
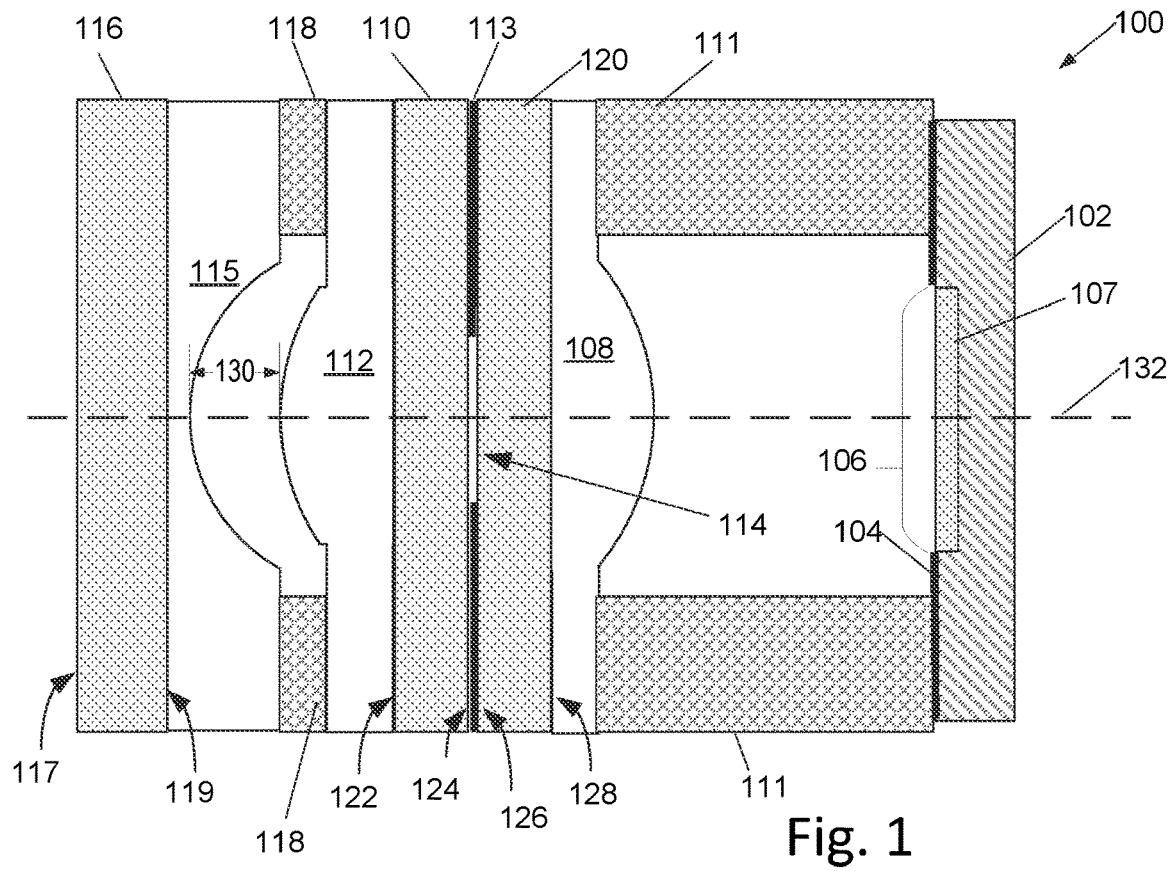
FIG. 1 is an illustration of a chip-level camera having a three-element lens on three substrates of the present design.

A chip-level camera 100 (FIG. 1) using a compact imaging camera lens system. FIG. 1 is a schematic diagram illustrating principles disclosed herein and is not intended to suggest dimensions of various elements. An image sensor integrated circuit 102 includes a photosensor array 107 for capturing images. In embodiments, image sensor integrated circuit 102 may include black mask 104 with an imaging array window 106. Black mask 104 serves to absorb stray light in areas around, but not directly in front of, photosensor array 107 of the image sensor integrated circuit 102.

In embodiments, photosensor array 107 is a silicon photodiode array, for example, a full-color image photodiode array with red, green, and blue filters in a Bayer pattern on its surface. In some other embodiments, the photodiode array has a four-filter pattern with red, green, blue, and infrared filters allowing four color red, green, blue, and near-infrared imaging across the visible and infrared spectrums from 380 to 1000 nanometers. In yet another embodiment, the photodiode array is a black-and-white array sensitive to the full spectrum of light from 380 to 1000 nanometers.

Chip-level camera 100 includes a wide-angle lens system having three lenses. The lens system includes first substrate 116, second substrate 110 and third substrate 120. First substrate 116 is held at a predetermined distance from second substrate 110 by first spacers 118. Third substrate 120 is held at a predetermined distance from image sensor integrated circuit 102 by a second spacers 111. First substrate 116 serves as a protective window for chip-level camera 100, where first surface 117 of first substrate 116 faces the outside of chip-level camera 100.

Concave L1 lens element 115 is formed on second surface 117 of first substrate 116. First convex L2 lens element 112 is formed on a first surface 122 of second substrate 110. A black diaphragm stop 113 having an opening 114 through which light can pass may be formed on second surface 124 of second substrate 110 or on first surface 126 of third substrate 120. Second substrate 110 and third substrate 120 are adjacent to each other.

A second convex L3 lens element 108 is formed on a second surface of third substrate 120 that is held at a predetermined distance from the image sensor integrated circuit 102 by a second spacer 111.

Figure 2:
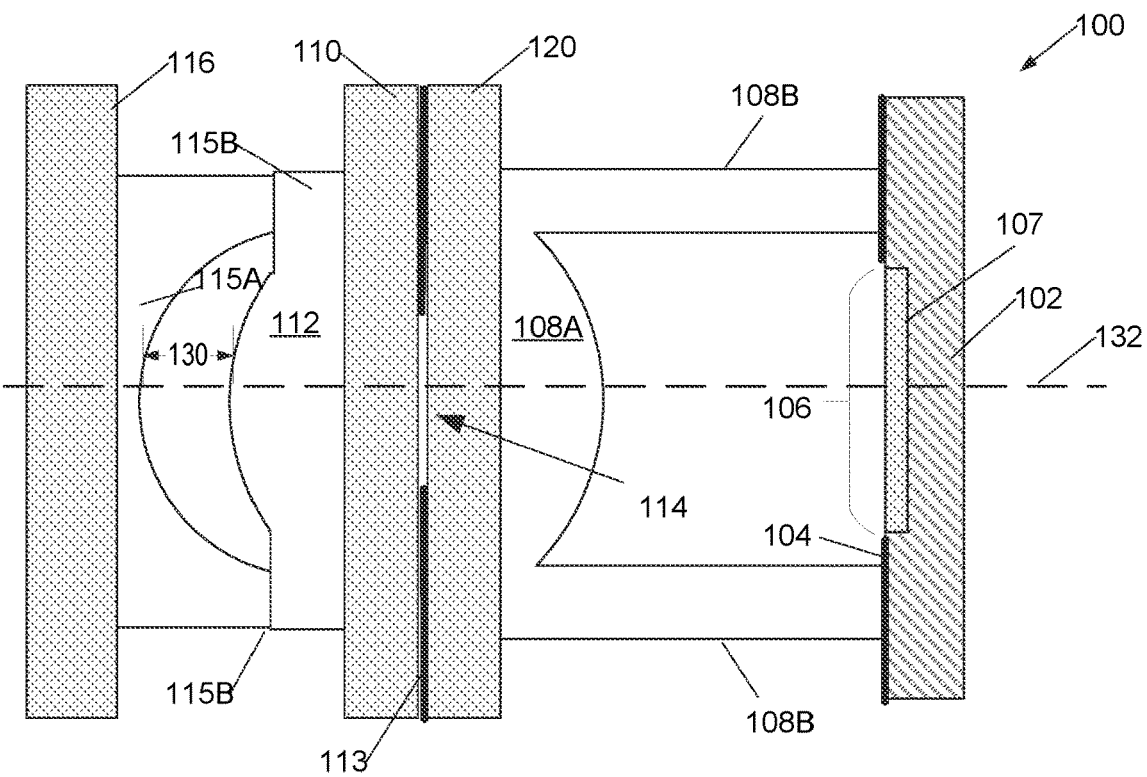
FIG. 2 is an illustration of a chip-level camera having a three-element lens on three substrates similar to that of FIG. 1 but with spacers integrally molded with lenses.

In the alternative embodiment of the chip-level camera as illustrated in FIG. 2, second spacer 111 is replaced by spacer arms 108B formed on L3 lens element 108A. First spacer 118 is replaced by spacer arms 115B formed on L1 lens element 115A. In another alternative embodiment (not shown) first spacer 118 is replaced by spacer arms formed on L2 element 112 instead of L1 lens element 115. In another embodiment second spacer 111 is replaced by spacer arms 108B formed on L3 element 108A.

In embodiments, lenses L1, L2, and L3 in the lens system of chip-level camera 100 is formed using a reflow-moldable polymer having refractive index NL1 between 1.48 and 1.66, Abbe number between 19 and 60, and transparent to visible light from 400 to 680 nanometer wavelengths. In particular embodiments, L1 lens element 115, L2 lens element 112, and L3 lens element 108 are also transparent to near-infrared light of 1000 to 680 nanometer wavelengths. In some embodiments, lenses L1, L2, and L3 are formed of a reflow-moldable polymer having Abbe number less than 40.

The L1 lens element 115 has a negative refractive power having an image-side surface being concave near optical axis 132. As used herein, "image-side" refers to facing image sensor IC 102 while "object-side" refers to facing away from image sensor IC 102 and towards an object being imaged. In embodiments, the surface of lens element 115 is aspheric.

L2 lens element 112 has positive refractive power having an object-side surface convex near optical axis 132. In embodiments, the surface of lens element 112 is aspheric. Air gap 130 is formed between the first lens L1 and second lens L2.

The L3 lens element 108 has positive refractive power having an image-side surface convex near optical axis 132. In embodiments, the surface of lens element 108 is aspheric.

Black diaphragm stop 113 is placed between the second substrate 110 and third substrate 120 in the lens system and includes a stop aperture 114.

L1 lens element 115 collects the wide angle incident rays reflected by an object to be imaged and controls the propagation direction of those rays into the lens system of chip-level camera 100. Concave L2 lens element 112 mitigates angles of rays entering the system, and guides them to pass through stop aperture 114. The combination of L2 lens element 112 and L3 lens element 108 is used to concentrate the rays and guide them toward to the image plane of photo sensor array 107. The convex-convex aspheric surfaces of L2 lens element 112 and L3 lens element 108 balances aberrations such as field curvature and distortion. Stop aperture 114 between L2 lens element 112 and L3 lens element 108 helps reduce the aberrations of the lens system.

In alternative embodiments, an additional infrared or other optical filter is provided. Such a filter may be deposited on second surface 124 of second substrate 110 or on a first surface 126 of third substrate 120. A filter may also be deposited directly on photosensor array 107 in window 106, photosensor array 107 typically being a photodiode array. In embodiments, the additional infrared optical filter blocks light of wavelengths greater than 700 nanometers.

L1 lens element 115 has a concave aspheric radius of curvature designated as R1, and L2 lens element 112 has a convex aspheric radius of curvature designated as R2. In embodiments, R1 and R2 meet the condition:

$$1.3 < ABS(R2/R1) < 2.2$$

This condition helps ensure the ratio of refractive power of L2 lens element 112 and L1 lens element 115 so the field of view angle is wide in a compact lens system.

L3 lens element has a convex aspheric surface having radius of curvature designated as R3. In embodiments, R1 and R3 meet the condition:

$$1.1 < ABS(R3/R1) < 2.4$$

This condition provides a ratio of refractive power of L3 element 108 and L1 lens element 112 that helps maintain a small chief ray angle and reduces distortion.

As disclosed herein, the total track length (TTL) of lens system is defined as the length from the vertex of the surface of L1 lens element facing object-side (adjacent to substrate 116) to the image plane of photo sensor array 107. The effective focal length of the lens system is defined as $f$. In embodiments, TTL and $f$ meet the condition of $$3 < (TTL/f) < 7$$

to limit overall length of the specific viewing-angle lens system by confining the ratio of the overall length to focal length of whole lens system under certain range so that the overall dimensions of chip-level camera 100 are compact.

In embodiments, each of the three aspheric lenses L1 lens element 115, L2 lens element 112, and L3 lens element 108 are designed according to aspheric formula:

$$Z(r) = \frac{r^2}{1 + \sqrt{1-(1+k)r^2}} + A_4 r^2 + A_6 r^6 + A_8 r^8 + A_{10} r^{10}$$

Where Z is sag, or deviation from a spherical surface lens, r is distance in radians from an optical axis of the lens, k is a conic parameter, and coefficients $A_4$, $A_6$, $A_8$, and $A_{10}$ describe the deviation of the surface from an axially symmetric quadric surface specified by radius of curvature R and k.

In an exemplary embodiment, with index of refraction of lenses L1, L2, and L3 being 1.62 with Abbe number of the lenses 26, the lens parameters are:

TABLE 1

| Lens | Radius mm | k | Diameter Mm | A4 | A6 | A8 | A10 |
|---|---|---|---|---|---|---|---|
| L1 | 0.352 | −3.24 | 0.818 | 1.84 | 2.13 | −77.1 | 287.5 |
| L2 | 0.657 | 0.576 | 0.672 | −3.37 | 56.0 | −598 | 2462 |
| L3 | −0.395 | −2.06 | 0.875 | −0.702 | −8.12 | 72.5 | 160 |

In an alternative embodiment, with index of refraction of lenses L2 and L3 being 1.62 with Abbe number 26, but lens L1 having index of refraction 1.51 and Abbe number 60, the lens parameters are:

TABLE 2

| Lens | Radius mm | K | Diameter Mm | A4 | A6 | A8 | A10 |
|---|---|---|---|---|---|---|---|
| L1 | 0.222 | −0.855 | 0.818 | −9.38 | 146 | −3441 | 46149 |
| L2 | 0.295 | −0.60 | 0.672 | −14.14 | 806 | −32728 | 746384 |
| L3 | −0.492 | −15.24 | 0.875 | −6.33 | 87.5 | −148 | −5711 |

In the representative embodiments of Tables 1 and 2 to illustrate principles disclosed herein, the follow parameters are also used:

TABLE 3

| Parameters |
|---|
| 1.3 < ABS(R2/R1) < 2.2 |
| 1.1 < ABS(R3/R1) < 2.4 |
| 3 < TTL/f < 7 |
| 1.48 < L1, L2, and L3 lens index of refraction <1.66 |
| 19 < Abbe number lenses L1, L2 and L3 <60; |
| In some embodiments Abbe number is <40. |
| Substrate 1 thickness 0.15 mm refractive index 1.517 |
| Substrate 2 thickness 0.25 refractive index 1.517 |
| Substrate 3 thickness 0.3 mm refractive index 1.517 |

Figure 3B:
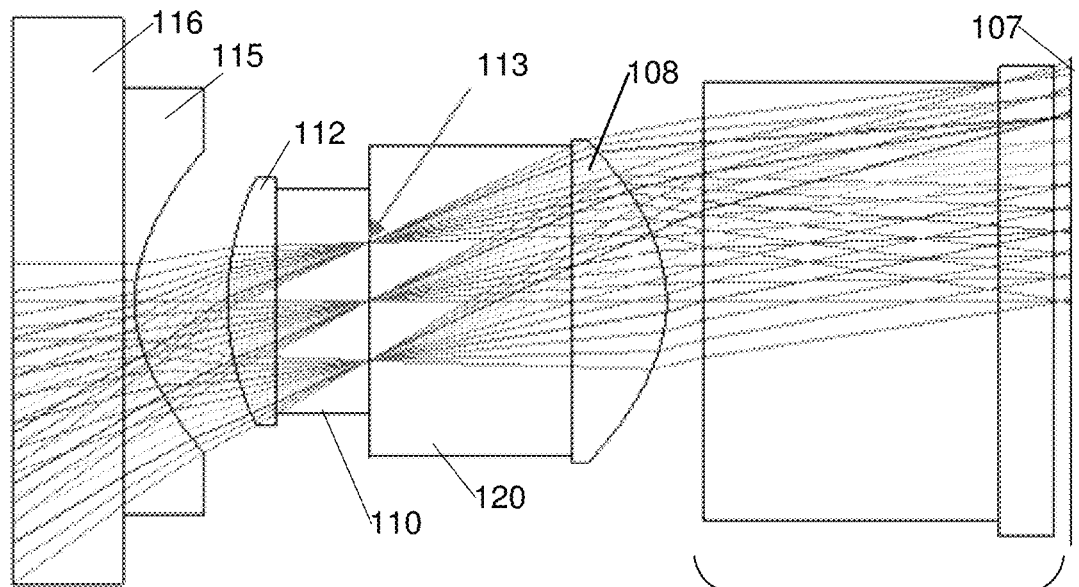
FIG. 3B portrays simulated ray tracings of an embodiment according to Tables 2 and 3 and FIG. 1.
Figure 3B:
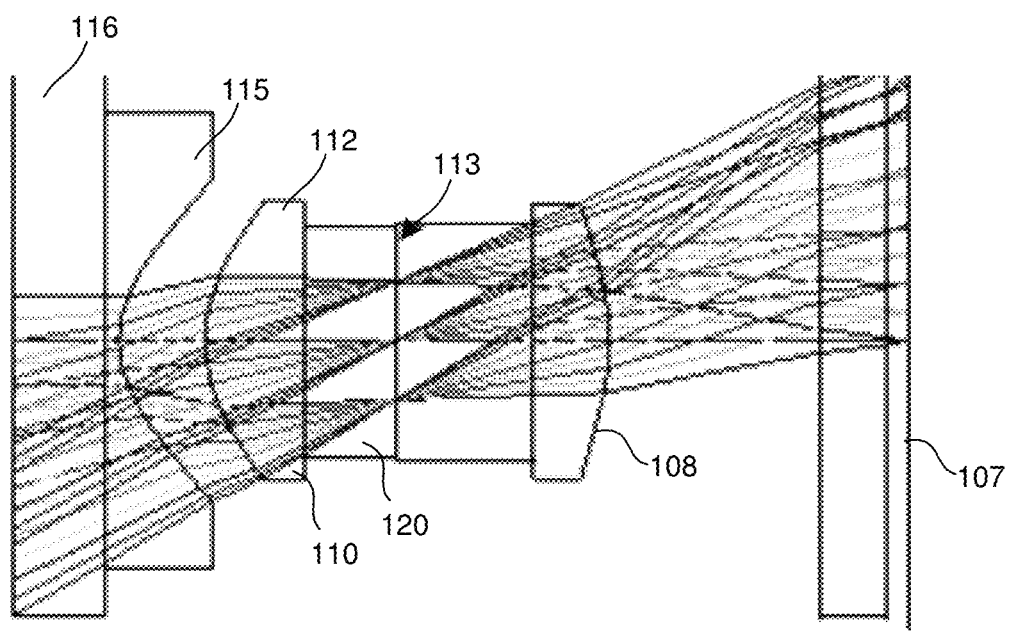

We simulated a lens system as herein described using the parameters and lens shapes defined in Table 1 and Table 3 with ray tracing as illustrated in FIG. 3A giving field of view 127 degrees, effective focal length of 0.45 mm and F 2.2. A similar simulation, illustrated in FIG. 3B, was performed with the parameters and lens shapes defined in Table 2 and Table 3 with field of view 99.6 degrees, effective focal length of 0.52 mm and F 2.5. In both simulations, chromatic aberration is well corrected.

Figure 4:
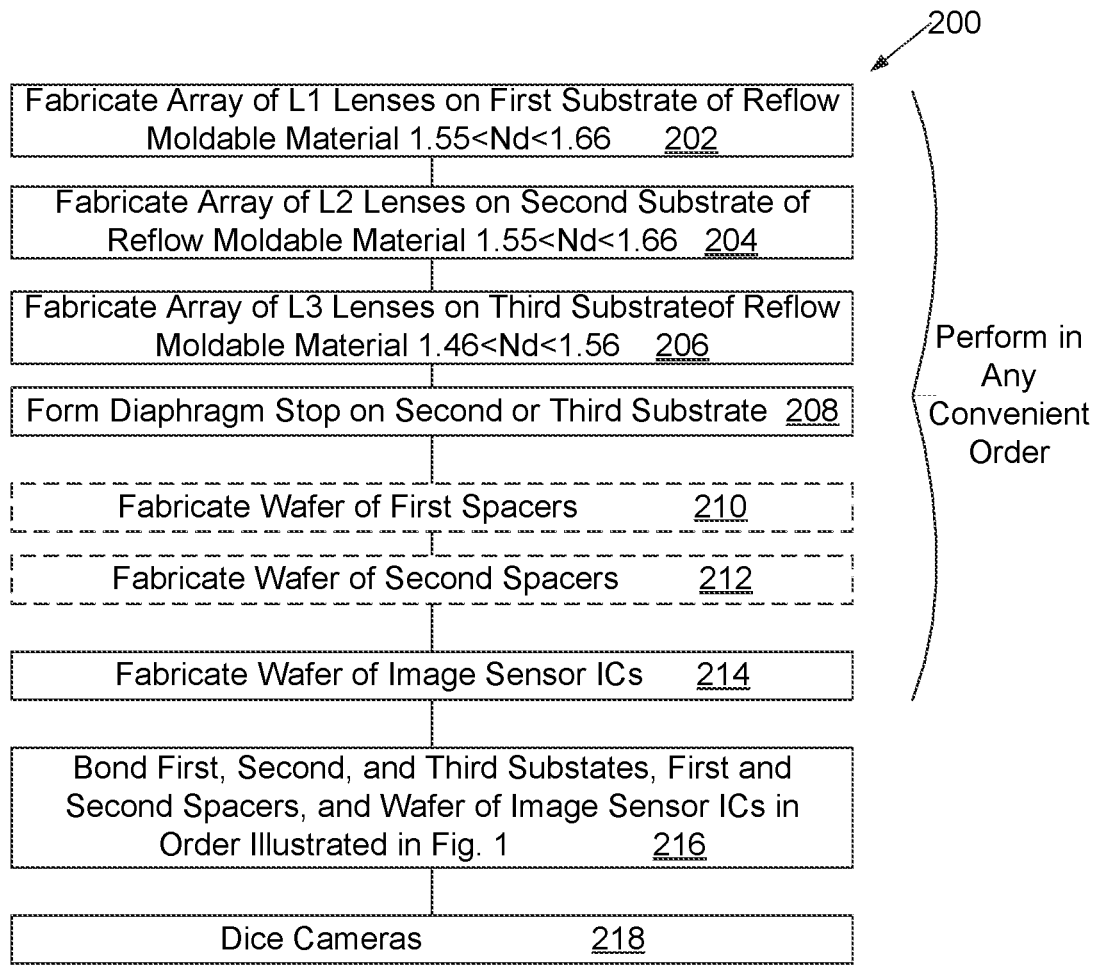
FIG. 4 is a flow chart illustrating a method of making the chip level camera of FIG. 1 and FIG. 2.

FIG. 4 is a flowchart illustrating a method 200 for assembling chip-level camera 100. Method 200 includes steps 202, 204, 206, 208, 216 and 218. In embodiments, method 200 also includes at least one of steps 210 and 212.

Arrays of L1 lens element 115, L2 lens element 112, and L3 lens element 108 are formed 202, 204, 206 on wafers forming first substrate 116, second substrate 110, and third substrate 120, along with diaphragm stop formed 208 on the second substrate 110 or third substrate 120 and wafers of spacers 118, 111 are formed 210, 212 if separate spacers are used, and a wafer of image sensor integrated circuits 102 is fabricated 214. These wafers may be fabricated in any order.

In method 200, an array of L1 lens elements 115 having radius R1 are formed 202 on first substrate 116. In an example of step 202, L1 lens elements 115 is formed of a reflow moldable material where 1.55<index of refraction<1.66.

In step 204, an array of L2 lens elements 112 having radius R2 are formed on second substrate 110. In an example of step 204, L2 lens elements 112 may be formed of a reflow moldable material where 1.55<index of refraction<1.66.

In step 206, an array of L3 lens elements 108 having radius R3 are formed on third substrate 120. In an example of step 206, L3 lens elements 108 are formed of reflow moldable material where 1.46<index of refraction<1.56.

In embodiments, lenses are formed by depositing a reflow moldable material, applying a wafer-sized mold having negative images of the lenses, and reflowing the reflow moldable material. In some embodiments, lens-extension spacer 108A and 115A as shown in FIG. 2 may also be formed as part of L1 and/or L3 lens formation in steps 202 and 206, or in L2 and/or L3 lens formation at steps 204 and 206.

In step 208, black diaphragm 113 including stop aperture 114 may be formed by depositing and etching on either third substrate 120 or second substrate 110.

In optional steps 210 and 212, spacers 118 and 111 of FIG. 1 may be formed in separate molded wafers.

The wafer of image sensor integrated circuits 102 may be fabricated 214 as known in the art of image sensor integrated circuits.

Component wafers are assembled and bonded together 216 to form an array of chip-level cameras 100 216, the substrates with lenses, and wafers of spacers and integrated circuits are stacked so the substrates, spacers if used, and lenses appear in the order illustrated in FIGS. 1 and 2, with first substrate 116 bearing L1 lenses 115, first spacer 118, second substrate 110 bearing L2 lenses 112, third substrate 120 bearing L3 lenses 108, second spacer 111, in front of the wafer of array image sensor integrated circuits 102. The stack is bonded together 216.

In step 218, After all wafers and spacers are bonded together, individual chip-cube-level cameras 100 are separated, or diced, for example, by sawing. Other methods of dicing may be used.

In a particular embodiment, L1 lenses are concave with radius 0.5 millimeter, the L2 lenses are convex with radius 0.3 millimeter, and the L3 lenses are convex with radius 0.22 millimeter.

Combinations

The features herein described can be combined in a variety of ways. Among combinations anticipated are:

A chip-level camera designated A includes an image sensor; a concave L1 lens element on an inside surface of a first substrate; a convex L2 lens element on a first surface of a second substrate; a diaphragm stop on a second surface of the second substrate or on a first surface of a third substrate, the diaphragm stop between the second and third substrates; a convex L3 lens element on a second surface of the third substrate spaced from the image sensor; a first spacer holding first substrate at a predetermined distance from the second substrate; and a second spacer holding the second substrate a predetermined distance from the image sensor. In embodiments, lens element L1 has concave aspheric radius of R1, and lens L2 convex aspheric radius of R2, such that 1.3<ABS(R2/R1)<2.2 and/or lens L3 has convex aspheric radius R3, where 1.1<ABS(R3/R1)<2.4.

A chip-level camera designated AA including the chip-level camera designated A wherein lens element L1 has a concave aspheric radius of curvature R1, and lens L2 a convex aspheric radius of curvature R2, such that 1.3 is less than absolute value of R2 divided by R1, and absolute value of R2 divided by R1 is less than 2.2.

A chip-level camera designated AB including the chip-level camera designated A or AA wherein lens L3 has a convex aspheric surface having radius R3, where 1.1 is less than an absolute value of R3 divided by R1, and the absolute value of R3 divided by R1 is less than 2.4.

A chip-level camera designated AC including the chip-level camera designated A, AA, or AB wherein lenses L1, L2, and L3 are formed of a reflow-moldable polymer having refractive index between 1.48 and 1.66, in a particular embodiment 1.61, with Abbe number between 19 and 60. In some embodiments, Abbe number of lenses L1, L2, and L3 is less than 40.

A chip-level camera designated AD including the chip-level camera designated A, AA, AB or AC wherein the first and second spacer are formed as spacer arms of the L1 and L3 lenses, respectively.

A chip-level camera designated AE including the chip-level camera designated A, AA, AB or AC wherein the first and second spacer are formed as spacer arms of the L2 and L3 lenses, respectively.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A chip-level camera comprises:
an image sensor integrated circuit having a photosensor array;
a concave L1 lens element formed on an inside surface of a first substrate;
a convex L2 lens element formed on a first surface of a second substrate;
a diaphragm stop formed on a second surface of the second substrate or on a first surface of a third substrate, the diaphragm stop between the second and third substrate;
a convex L3 lens element formed on a second surface of a third substrate spaced from the image sensor integrated circuit;
a first spacer configured to hold first substrate at a predetermined distance from second the substrate;
and a second spacer configured to hold the second substrate at a predetermined distance from the image sensor integrated circuit;
wherein lens element L1 has a concave aspheric radius of R1, and lens L2 a convex aspheric radius of R2, such that 1.3 is less than absolute value of R2 divided by R1, and absolute value of R2 divided by R1 is less than 2.2.

2. The chip-level camera of claim 1 wherein lens L3 has a convex aspheric surface having radius R3, where 1.1 is less than an absolute value of R3 divided by R1, and the absolute value of R3 divided by R1 is less than 2.4.

3. The chip-level camera of claim 2 wherein lenses L1, L2, and L3 are formed of a reflow-moldable polymer having refractive index between 1.48 and 1.66 and Abbe number between 19 and 60.

4. The chip-level camera of claim 3 wherein the first and second spacer are formed as spacer arms of the L1 and L3 lenses, respectively.

5. The chip-level camera of claim 3 wherein the first and second spacer are formed as spacer arms of the L2 and L3 lenses, respectively.

6. The chip-level camera of claim 3 wherein the first and second spacer are formed as separate wafers of spacers.

7. A method of making a chip-cube camera comprising:
forming an array of first lenses having a first radius (R1) on a first substrate of reflow moldable material where an index of refraction of the reflow moldable material is between 1.48 and 1.66;
forming an array of second lenses having a second radius (R2) on a second substrate of the reflow moldable material;
forming an array of third lenses having a third radius (R3) of reflow moldable material;
forming a diaphragm stop on the second or third substrate;
fabricating a wafer of image sensor integrated circuits;
stacking the substrates with lenses and the wafer of image sensor integrated circuits in order such that L1 is before L2, L2 is before L3, and L3 is before the image sensor integrated circuit;
bonding the wafers of lenses and image sensor integrated circuits together; and
dicing the bonded wafers into individual cameras;
where 1.3 is less than an absolute value of (R2/R1), and the absolute value of (R2/R1) is less than 2.2.

8. The method of claim 7 where 1.1 is less than an absolute value of R3/R1, and the absolute value of R3/R1 is less than 2.4.

9. The method of claim 8 where the first lenses are concave with radius 0.5 millimeter, and the second lenses are convex with radius 0.3 millimeter.

10. The method of claim 8 where an Abbe number of the first and second lenses is less than 60.

11. The method of claim 8 further comprising forming first and second spacers, where the during the step of stacking the first spacer is positioned between L1 and L2, and the second spacer is positioned between L3 and the wafer of image sensor integrated circuits.

12. The method of claim 11 where the first and second spacer are formed independently of the L1, L2, and L3 lenses.

13. The chip-level camera of claim 11 wherein the first and second spacer are formed as spacer arms of the L1 and L3 lenses, respectively.

14. The chip-level camera of claim 11 wherein the first and second spacer are formed as spacer arms of the L2 and L3 lenses, respectively.

* * * * *